United States Patent
Zhang

(10) Patent No.: US 9,136,434 B2
(45) Date of Patent: Sep. 15, 2015

(54) SUBMICRO-FACET LIGHT-EMITTING DEVICE AND METHOD FOR FABRICATING THE SAME

(71) Applicant: Invenlux Limited, Central (HK)

(72) Inventor: Jianping Zhang, El Monte, CA (US)

(73) Assignee: INVENLUX LIMITED, Central (HK)

(*) Notice: Subject to any disclaimer, the term of this patent is extended or adjusted under 35 U.S.C. 154(b) by 0 days.

(21) Appl. No.: 13/735,771

(22) Filed: Jan. 7, 2013

(65) Prior Publication Data
US 2014/0191187 A1   Jul. 10, 2014

(51) Int. Cl.
*H01L 33/04* (2010.01)
*H01L 33/24* (2010.01)
*H01L 33/00* (2010.01)

(52) U.S. Cl.
CPC ............... *H01L 33/24* (2013.01); *H01L 33/007* (2013.01)

(58) Field of Classification Search
USPC .................. 257/13, 76, E33.006, E33.025, 9
See application file for complete search history.

(56) References Cited

U.S. PATENT DOCUMENTS

2011/0291069 A1* 12/2011 Kim ................................ 257/13
2011/0309382 A1* 12/2011 Lowgren ......................... 257/88

FOREIGN PATENT DOCUMENTS

WO    WO 2012144997 A1 * 10/2012

OTHER PUBLICATIONS

Yukio Narukawa et al., "White light emitting diodes with super-high luminous efficacy" Journal of Physica D: Applied Physics, vol. 43, No. 354002, (2010), pp. 1-6.

* cited by examiner

*Primary Examiner* — Chuong A Luu
*Assistant Examiner* — Rodolfo Fortich
(74) *Attorney, Agent, or Firm* — J.C. Patents

(57) ABSTRACT

A light emitting device comprises an n-type layer, a p-type layer, and an active region sandwiched between the n-type layer and the p-type layer, wherein the active-region has a wavy structure with nano or micro fluctuations in its thickness direction. The n-type layer comprises crystal facets on its upper surface, and the active-region is conformally formed on the upper surface of the n-type layer and substantially follows the shape of the crystal facets so as to form the wavy structure. A method for fabricating the same is also provided.

11 Claims, 8 Drawing Sheets

SUBMICRO-FACET LIGHT-EMITTING DEVICE AND METHOD FOR FABRICATING THE SAME

FIELD OF THE INVENTION

The present invention relates in general to a light-emitting device, such as light emitting diode (LED), more particularly to a light-emitting device having submicron facets, such as III-nitride light-emitting device, and a method for fabricating the same.

DESCRIPTION OF THE RELATED ART

III-nitride based light-emitting devices such as light-emitting diodes (LEDs) are widely acknowledged as the next generation light sources and are currently emerging as strong replacement of incandescent and fluorescent lamps in general lighting. For example, the field of interest uses Cerium-doped yttrium aluminum garnet (YAG:Ce) phosphor to convert InGaN multiple-quantum-well (MQW) LED's blue emission into white light, yielding commercial white light LEDs with luminous efficacies in the range of 80-130 lm/W. The R&D White LED luminous efficacy record reported so far has reached 183 lm/W (Y. Narukawa et al, J. Phys. D: Appl. Phys. 43, 354002 (2010).).

For white LEDs to gain dominance in general lighting luminous efficacy is on the one hand very essential, on the other hand, cost per kilolumen is equally important. To reduce the cost per kilolumen, it is preferred to have one single device capable of delivering a great deal of lumens. This is a straightforward approach to cut the cost by eliminating additional package spending.

A single chip LED in the prior art is limited in delivering a great deal of lumens for several inherent shortcomings. Firstly, the prior art LEDs are limited in chip size, because light extraction efficiency decreases as chip size increases. Secondly, the prior art white LEDs suffer from a fact called efficiency droop, characterized in efficiency setback with increasing current density. The efficiency droop has its physical root in unbalanced electron and hole transport properties in wide bandgap semiconductors, where holes are in deficiency and with much lower mobility, as in comparison to electrons. Efficiency droop is further exaggerated in c-plane orientated III-nitride LEDs, because the polarization field within c-plane III-nitride quantum wells reduces the carrier capture probability, resulting in carrier leakage out of quantum wells.

It is the intention of the present invention to realize LEDs with superior performance at high-current injection regimes and capable of delivering more white light lumens from a single chip.

SUMMARY OF THE INVENTION

Disclosed herewith is a light emitting device having a wavy active-region for enlarged active-region volume without increasing the total lateral area of the active-region (while satisfying the required light-emitting thickness of the layers within the active-region) so as to enhance the total current-sustaining capacity and light extraction, and deliver more white light lumens from a single LED chip.

In some embodiments, a wavy active-region is realized by growing the active-region on crystal facets. In some embodiments, the facets can be formed on top of micro or submicro pillars.

The wavy structure can be formed in a portion or portions of the active-region, preferably is formed substantially over the entire active-region.

One aspect of the present invention provides a light emitting device comprising:
  an n-type layer;
  a p-type layer;
  an active region sandwiched between the n-type layer and the p-type layer;
  wherein the active-region has a wavy structure with nano or micro fluctuations in its thickness direction.

Preferably, the n-type layer comprises crystal facets on its upper surface, and the active-region is conformally formed on the upper surface of the n-type layer and substantially follows the shape of the crystal facets so as to form the wavy structure.

Optionally, the n-type layer comprises (00.1)-oriented III-nitride pillars and the crystal facets are formed on top of the (00.1)-oriented III-nitride pillars, wherein each of the pillars provides six facets due to six-fold crystal structure symmetry; or the n-type layer comprises (111)-oriented III-nitride pillars and the crystal facets are formed on top of the (111)-oriented III-nitride pillars, wherein each of the pillars provides four facets due to four-fold crystal structure symmetry.

Optionally, the crystal facets comprise (10.1) facets or (11.1) facets.

Optionally, the (00.1)-oriented III-nitride pillars are arranged in a hexagonal lattice pattern with a lattice constant of 150 nm to 1000 nm, or from 150 nm to 500 nm and the diameter of the pillars can be from 140 nm to 1000 nm, or from 140 nm to 500 nm.

Optionally, the (00.1)-oriented III-nitride pillars can have a density of $5 \times 10^8$ cm$^{-2}$ to $5 \times 10^9$ cm$^{-2}$.

Optionally, the (00.1)-oriented III-nitride pillars can contain an AlGaN/GaN superlattice structure, with Al-fraction not less than 20%, or contain a GaN/InGaN superlattice structure, with In-fraction not less than 4%.

Optionally, the (00.1)-oriented III-nitride pillars can contain a strain-modulation structure which contains a silicon concentration peak of above $5 \times 10^{19}$ cm$^{-3}$ with a full-width at half-maximum (FWHM) of 15-20 nm, when being measured by a depth profiling metrology such as secondary ion mass spectrometry (SIMS).

Optionally, gaps are formed between neighboring (00.1)-oriented III-nitride pillars, specifically the gaps can have a dimension of 3-200 nm.

Optionally, the (00.1)-oriented III-nitride pillars can have a height larger than 500 nm.

Optionally, the light-emitting device comprises a mask layer embedded in the n-type layer, wherein the mask layer consists of a growth suppression area and a growth seeding area formed by nano-scale openings, and the (00.1)-oriented III-nitride pillars grow from and penetrate through the openings.

Another aspect of the present invention provides a method for making a light emitting device comprising:
  providing a substrate;
  forming an n-type layer over the substrate;
  forming a mask layer on the n-type layer, wherein the mask layer consists of growth suppression area and growth seeding area, the growth seeding area is formed by nano-scale openings which expose the n-type layer;
  forming pillars on the mask layer through the nano-scale openings and forming crystal facets on tops of the pillars;
  conformally growing an active-region on the crystal facets on tops of the pillars; and
  forming a p-type layer over the active-region.

Optionally, the pillars are (00.1)-oriented III-nitride pillars, wherein each of the pillars provides six facets because of the six-fold crystal structure symmetry.

Optionally, the crystal facets are mainly (10.1) facets, or (11.1) facets.

Optionally, the (00.1)-oriented III-nitride pillars are arranged in a hexagonal lattice pattern with a lattice constant of 150 nm to 1000 nm, and the diameter of the pillars can be from 140 nm to 1000 nm.

Optionally, the (00.1)-oriented III-nitride pillars have a density of $5 \times 10^8$ cm$^{-2}$ to $5 \times 10^9$ cm$^{-2}$.

Optionally, the step of forming the pillars includes forming an AlGaN/GaN superlattice structure, so that the (00.1)-oriented III-nitride pillars contain an AlGaN/GaN superlattice structure, with Al-fraction not less than 20%.

Optionally, step of forming the pillars includes forming a GaN/InGaN superlattice structure, so that the (00.1)-oriented III-nitride pillars contain a GaN/InGaN superlattice structure, with In-fraction not less than 4%.

Optionally, the step of forming the pillars includes silicon concentration enhancement step, so that the (00.1)-oriented III-nitride pillars contain at least one silicon concentration peak of above $5 \times 10^{19}$ cm$^{-3}$ with a full-width at half-maximum (FWHM) of 15-20 nm, when being measured by a depth profiling metrology such as secondary ion mass spectrometry (SIMS).

BRIEF DESCRIPTION OF THE DRAWINGS

The accompanying drawings, which are included to provide a further understanding of the invention and constitute a part of this application, illustrate embodiments of the invention and together with the description serve to explain the principle of the invention. Like reference numbers in the figures refer to like elements throughout, and a layer can refer to a group of layers associated with the same function.

FIG. 6 can be a plan view of FIG. 5, FIG. 7 and FIG. 8.

DETAILED DESCRIPTION OF EMBODIMENTS

Figure 1:
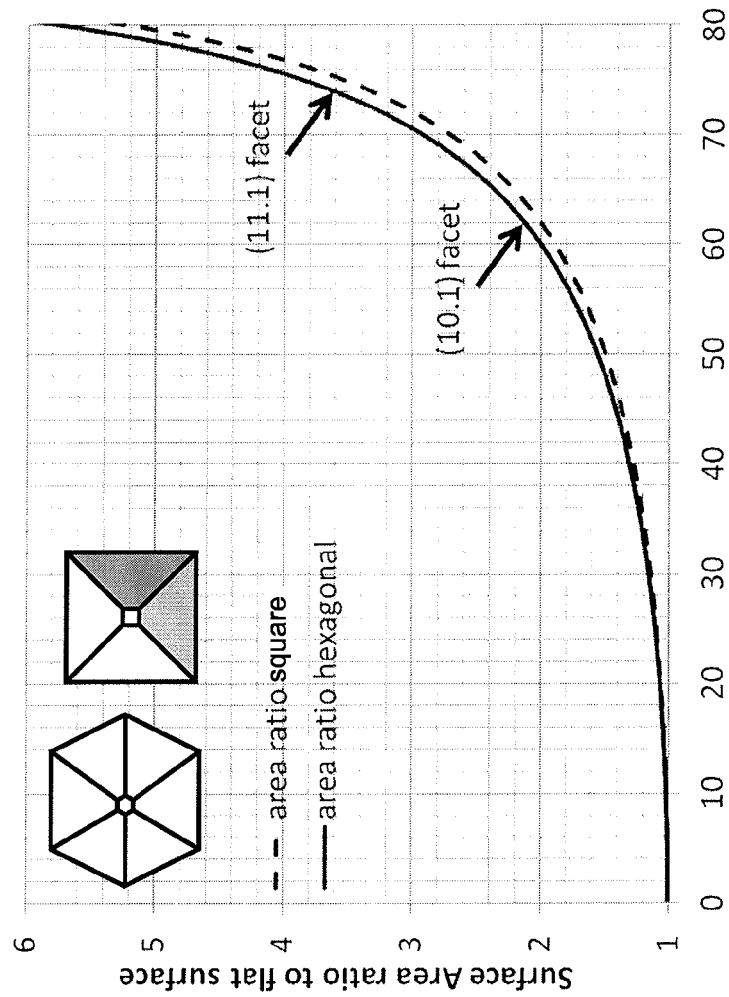
FIG. 1 plots the active-region ratio of a submicro-facet light-emitting device in accordance with embodiments of the present invention to the flat active-region of a prior-art light-emitting device, as a function of the facet inclination angle.

Disclosed herewith is a light emitting device having sub-micro-facets for enlarged active-region and enhanced light extraction. In some embodiments, the light-emitting device according to the present invention includes high-density micro or submicro pillars on which an active region is formed. This is to say that these pillars' cross-sectional dimension is in the micron or submicron range, for example, from 500 nm to 1200 nm. The pillars' height, or length, can also be in the submicron to micron range, for example, from 600 nm to 2000 nm. The density of the pillars can be in the range of $5 \times 10^8$ cm$^{-2}$ to $5 \times 10^9$ cm$^{-2}$. These pillars have tapering tops formed by crystal facets. In some embodiments, these are c-oriented gallium nitride (GaN) pillars, and the facets are (10.1) or (11.1) facets. The pillars are preferred to be arranged in a close-packed hexagonal pattern (lattice) or square pattern, and the separation between pillars is preferred to be within 100 nm, for example, from 0 nm to 100 nm. When the separation is zero nanometer, all pillars are in contact with their nearest neighboring pillars except the tapering tops formed by crystal facet planes.

The facet tops of the pillars forms a wavy yet continuous growth front if the pillar separation is zero, or many slightly spaced close-packed hexagonal growth fronts if the pillar separation is nonzero.

In some embodiments, a III-nitride quantum well (QW) or multiple quantum well (MQW) is formed on the above-mentioned growth fronts as an active-region for a light-emitting device. For example, AlGaN/GaN, AlGaN/InGaN, GaN/InGaN, AlInGaN/InGaN, AlInGaN/GaN QWs or MQWs can be formed on the growth fronts. Following the active-region, p-type materials such as Mg-doped AlGaN, GaN, InGaN layers can be formed sequentially. Despite the separation of the pillars, after p-type material deposition, the pillars are all electrically connected via the p-type materials.

The wavy active-region of the present invention is applicable to any conventional light emitting devices by replacing the conventional active-region with the wavy action-region of the present invention. Light emitting device so-formed according to the present invention has enlarged active-region volume suitable for high-current operation and enhanced light extraction and good for small or big chip size devices, as compared to the prior art light-emitting devices.

The fabrication method of the pillars and light-emitting devices containing these pillars is also provided in the following detailed description.

Throughout the specification, the term III-nitride or nitride in general refers to metal nitride with cations selecting from group IIIA of the periodic table of the elements. That is to say, III-nitride includes MN, GaN, InN and their ternary (AlGaN, InGaN, InAlN) and quaternary (AlInGaN) alloys. III-nitride or nitride can also include small compositions of transition metal nitride such as TiN, ZrN, HfN with molar fraction not larger than 10%. For example, III-nitride or nitride may include $Al_xIn_yGa_zTi_{(1-x-y-z)}N$, $Al_xIn_yGa_zZr_{(1-x-y-z)}N$, $Al_xIn_yGa_zHf_{(1-x-y-z)}N$, with (1-x-y-z)≤10%, 0≤x, y, z≤1. A III-nitride layer or active-region means that the layer or active-region is made of III-nitride semiconductors.

In the following contents, nitride light-emitting devices or structures, especially, c-plane oriented nitride light-emitting devices or structures are used as embodiments to elucidate the principle and spirit of the present invention. Those of ordinary skills in the field can apply the teachings in this specification and given by the following embodiments of nitride light-emitting devices or structures to II-VI semiconductor (e.g.

ZnO, CdS, et al, based) and other semiconductor (e.g., AlIn-GaP, AlInGaAs et al based) devices or light-emitting devices without creative work.

The prior art LEDs utilize two-dimensional flat active-regions for light-generation. That is to say, when measured by surface metrologies such as atomic force microscopy, the prior art active-regions used in LEDs are flat, usually with a surface roughness of RMS (root mean square) less than 50 nm, or more often less than 10 nm. In contrast, the active-region according to the present invention is roughened or has a wavy structure. Preferably, the roughness or wavy structure is caused by crystallographic faceting. For example, in the prior art, GaN/InGaN MQW active-region is made of two-dimensional flat layers lying in c-plane. According to embodiments of the present invention, a GaN/InGaN MQW active-region is formed on roughened or wavy surface other than c-plane. In some embodiments, the active-region can be formed on facets (10.1) planes. In other embodiments, the active-region can be formed on facets (11.1) planes. The active-region can also be formed on other facets or on mixed facets of different types. For a hexagonal c-plane unit area, it can have six facets, for example, six (10.1) facets or six (11.1) facets (referring to inset to FIG. 1), with inclination angles to c-plane being of 61.9 and 72.9 degree, respectively. For a square c-plane unit area, it can have four facets.

When the active-region is formed on the six (10.1) or (11.1) facets instead of the basal c-plane unit area, compared with a conventional flat active-region occupying the same lateral size of active-region area and having the same layer thickness, the active-region volume is enlarged by a factor of approximately 2.1 or 3.4, respectively, as seen from FIG. 1.

The active-region can also be formed on roughened surface formed by facets other than (10.1), or (11.1) planes. The other possible faceting planes are listed in table 1, with different inclination angles to c-plane.

TABLE 1

Inclined planes and inclination angles to (00.1) plane in wurtzite structure crystals

| inclined plane | angle to c-plane (deg) |
| --- | --- |
| (10.1) | 61.9 |
| (10.2) | 43.2 |
| (10.3) | 32 |
| (10.4) | 25 |
| (11.1) | 72.9 |
| (11.2) | 58.4 |
| (11.3) | 47.3 |
| (11.4) | 39.1 |
| (11.5) | 33 |
| (11.6) | 28.5 |

Shown in FIG. 1 is the surface area ratio to the flat basal plane when the surface is formed by crystallographic facets with different inclination angles. The inset shows a hexagonal and a square area unit with six-fold and four-fold symmetric facets, respectively. The six-fold symmetric faceting may happen in hexagonal lattice structure with basal plane lying in (00.1) plane, and the four-fold symmetric faceting may happen in cubic lattice structure with basal plane lying in (111) plane. As can be generally observed, by forming the active-region on the facet planes other than the flat basal plane, the active-region volume can be enlarged without increasing the thickness of the basal portion of the active-region or the thickness of the MQW layers of the active-region. The active-region volume increases sharply with the increase in facet inclination angle to the basal plane. For example, by forming the active-region on the (10.1) facets instead of the (00.1) basal plane, the active-region volume can be enlarged to 2.1 times, and by forming the active-region on the (11.1) facets instead of the (00.1) basal plane, the active-region volume can be enlarged to 3.4 times.

Forming the active-region on the facet planes instead of the basal (00.1) plane offers the benefits:
  a) enlarging active-region volume allowing for high-current injection;
  b) MQW active-region is no longer in the polar c-plane, resulting in reduced polarization field within MQW, which in turn gives rise to internal quantum efficiency and mitigates quantum efficiency droop under high-current injections;
  c) Greatly enhancing light extraction efficiency.

A GaN layer grown on basal c-plane can have facets when the growth conditions are alerted. As reported by Jiang et al ("Optical resonance modes in GaN pyramid micro cavities", H. X. Jiang, J. Y. Lin, K. C. Zeng, and W. Yang, Appl. Phys. Lett., 75, 763 (1999)), smooth (10.1) facets have been achieved via selective-area epitaxy in MOCVD (metalorganic chemical vapor disposition), the contents of which is herein incorporated by reference in its entirety. In general, it is observed that by limiting the growth seeding area, (00.1) layer growth will turn into facet growth, and the facet inclination angle depends on growth temperature and V/III molar ratio, which in the GaN MOCDD growth is the ammonia/organic gallium molar flow ratio.

Figure 2:
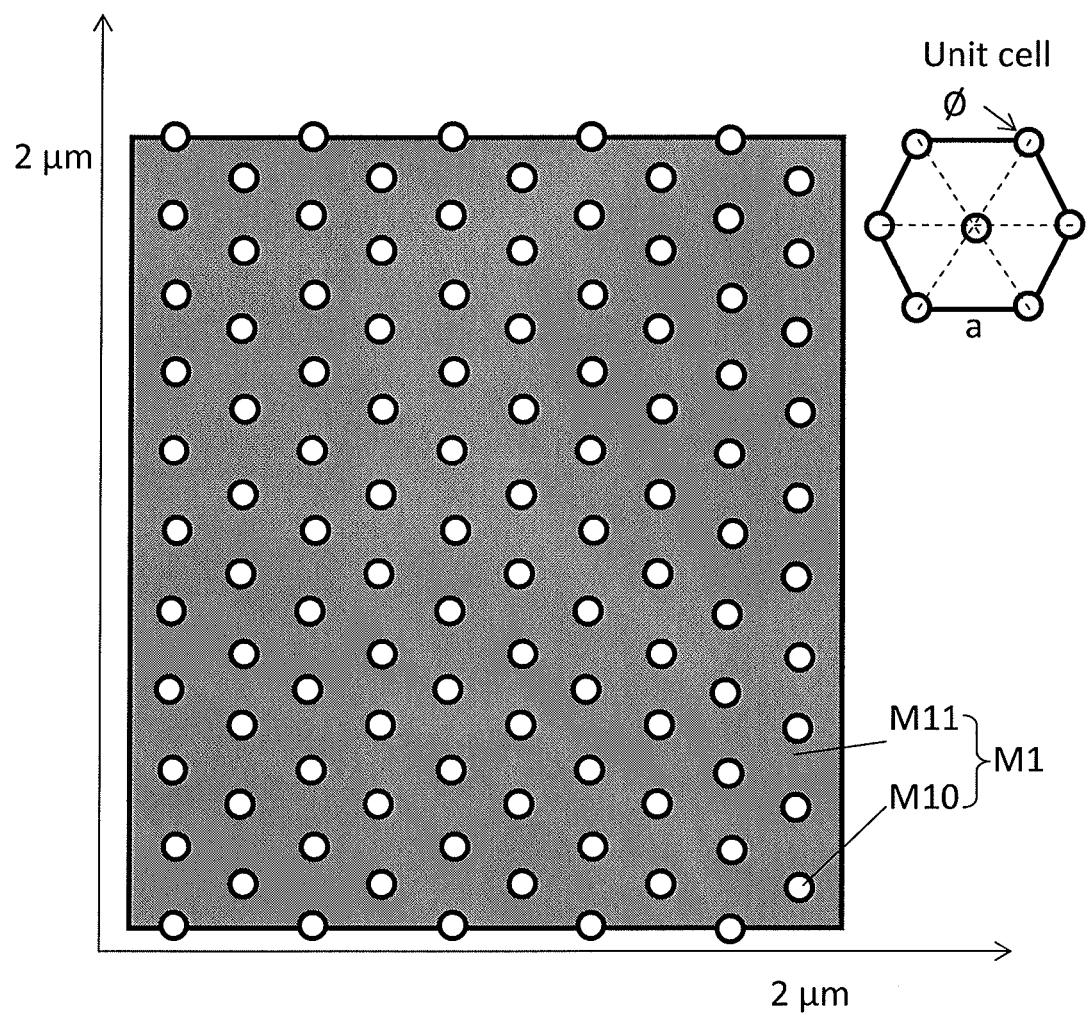
FIG. 2 illustrates a mask design for close-packed hexagonal lattice submicro pillars' formation according to one aspect of the present invention. Also shown in the upright as insert is the unit cell to form such a mask.
Figure 3:
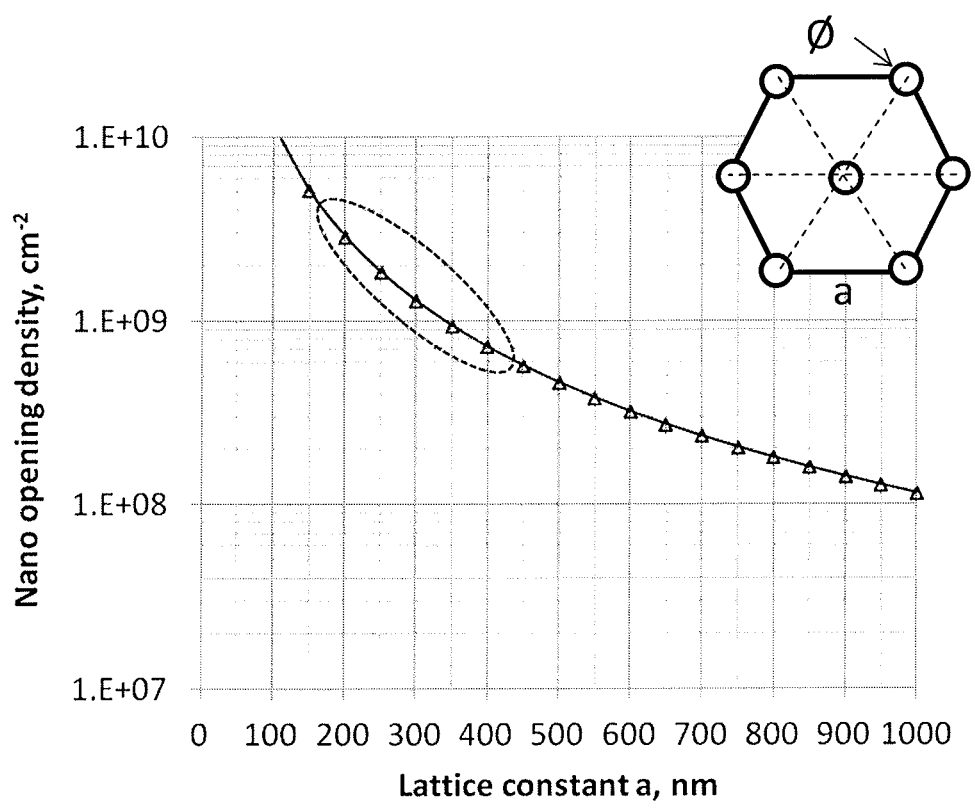
FIG. 3 plots the nano-opening density (=pillar density) as a function of the unit cell lattice constant a. Also shown in the upright as insert is the unit cell.

Shown in FIG. 2 is a growth mask layer design according to an embodiment of the present invention to limit the growth seeding area. The mask layer M1 consists of growth suppression area M11 and growth seeding area represented by the nano-scale openings M10. The nano-scale openings M10 are arranged in a close-packed periodic hexagonal lattice structure. The nano-scale opening M10 can also be arranged in other patterns such as square lattice structure. The inset (upper right) to FIG. 2 shows a unit cell of the hexagonal lattice structure. In each unit cell there are three effective nano-scale openings M10 forming growth seeding area. The nano-scale opening M10 has a diameter Ø, and the unit cell has a lattice constant a. According to FIG. 2, if the whole area is of 2×2 μm², then the opening M10 has a density of $2.5 \times 10^9$ cm$^{-2}$. As for the periodic hexagonal lattice structure shown in FIG. 2, the density of nano-scale opening M10 is plotted against lattice constant a in FIG. 3, and the preferable density range is roughly circled in the plot. According to embodiments of the present invention, the nano-scale opening M10 is preferred to have density from $5 \times 10^8$ cm$^{-2}$ to $5 \times 10^9$ cm$^{-2}$, or $8 \times 10^8$ cm$^{-2}$ to $2 \times 10^9$ cm$^{-2}$, a lattice constant a from 150 to 430 nm, or from 250 to 350 nm. There is no specific restriction to the thickness of the mask layer M1 as long as it can provide growth seeding for the facets. Generally, the thickness of the mask layer M1 is in the range from 50 nm to 250 nm. In FIG. 2, openings M10 are shown as round shape. Openings M10 may have other regular or irregular shapes, such as hexagonal or square shape. When openings M10 are not in round shape, the above mentioned diameter represents the maximum cross-sectional dimension of the opening.

Figure 4:
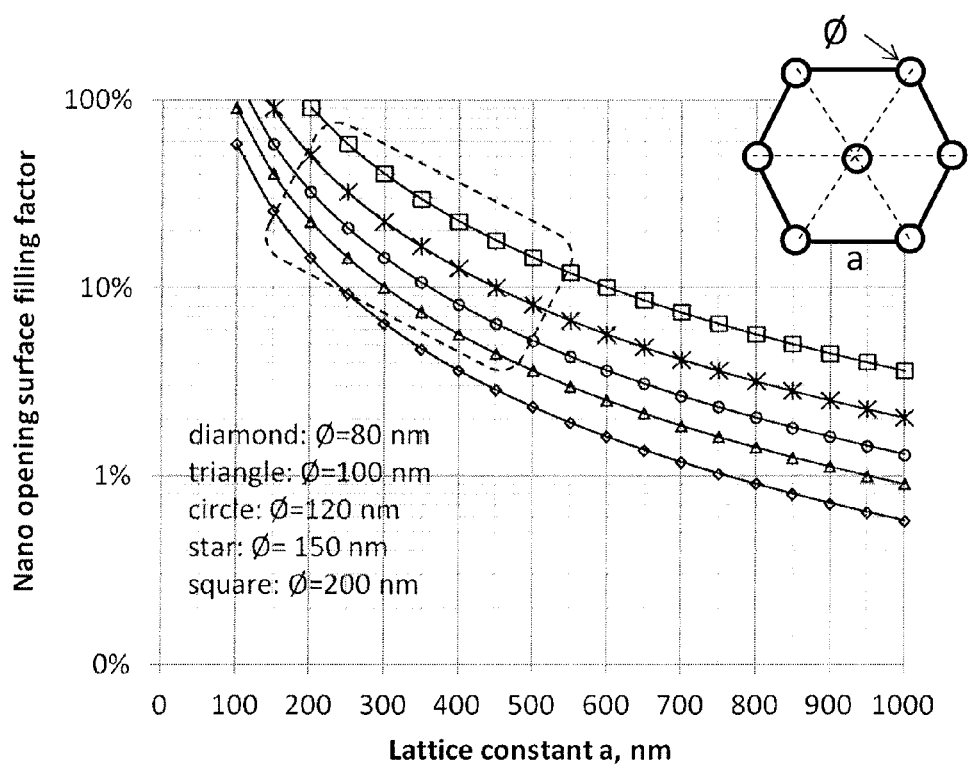
FIG. 4 plots the nano-opening surface filling factor as a function of unit cell lattice constant a and nano-opening diameter Ø. Also shown in the upright as insert is the unit cell.

Further in FIG. 4, for the periodic hexagonal lattice structure shown in FIG. 2 the filling factors of nano-scale opening M10 are plotted against lattice constant a and opening diameter Ø. The filling factor is defined as the area ratio of the openings M10 (area sum of each individual opening) over the whole area where openings M10 are distributed. The preferred filling factors are roughly circumvented in FIG. 4, covering the range from 6% to 60%. When the diameter of the nano-scale opening M10 is varied between 80 nm to 200 nm, the lattice constant a is varied between 150 nm to 550 nm. For diameters of 80, 100, 120, 150 and 200 nm, the lattice constant a can be in the range of 100-350, 150-450, 150-500, 200-550, and 250-800 nm, respectively.

Figure 5:
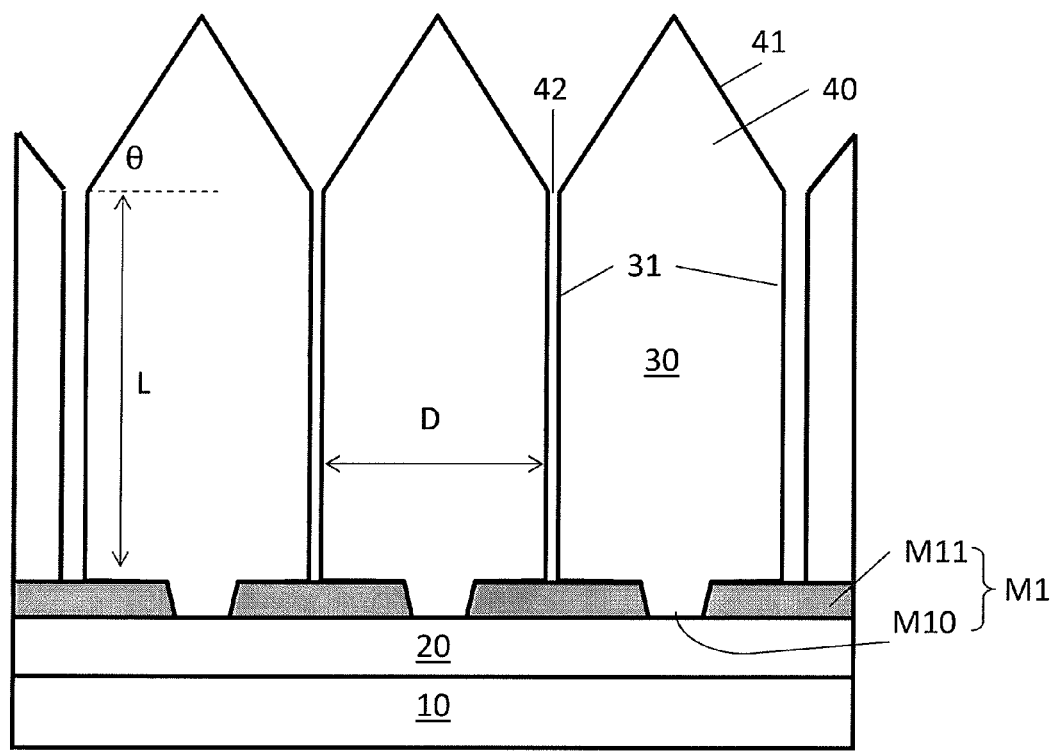
FIG. 5 illustrates the cross-sectional view of the submicro pillars with tapering tops formed by crystal facets according to one aspect of the present invention.

Illustrated in FIG. 5 is a cross-sectional view of many submicro facets formed according to an embodiment of the present invention. Substrate 10 can be any suitable substrate for GaN epitaxial growth. For example, substrate 10 can be a single crystal substrate including c-plane sapphire, GaN, AlN, ZnO, or (111) plane Si and GaAs. Substrate 10 can also be a non-crystal substrate including W, Mo, quartz, AlN ceramic, or $Al_2O_3$ ceramic, as long as care is taken to ensure (00.1) or (111) oriented GaN seeds can be formed over substrate 10. Formed on substrate 10 is a GaN-containing layer (structure) 20. Layer 20 can be a single GaN layer, or a layered structure containing stacked GaN layer, AlGaN layer, or InGaN layer. Layer 20 provides growth template for the following submicro facets formation thereon, and is preferred to be of good n-type conductivity. For example, layer 20 can contain a 1-5 µm thick, such as 3-µm-thick, Si-doped GaN layer with sheet resistance as small as 10 Ω/square.

Formed on layer 20 is mask layer M1 consisting of growth suppression area M11 and growth seeding area represented by the nano-scale openings M10. The design of mask layer M1 can be referred to FIG. 2-FIG. 4, with the proper selection of the lattice constant a, nano-scale opening diameter Ø, so as to get the desired nano-scale opening density and filling factor. The fabrication of mask layer M1 is known in the prior art, including nano-imprinting and nanolithography steps. The growth suppression area M11 is formed by a material layer not favoring for GaN growth. For example, M11 can be made from silicon dioxide ($SiO_2$) or silicon nitride ($SiN_x$).

Figure 6:
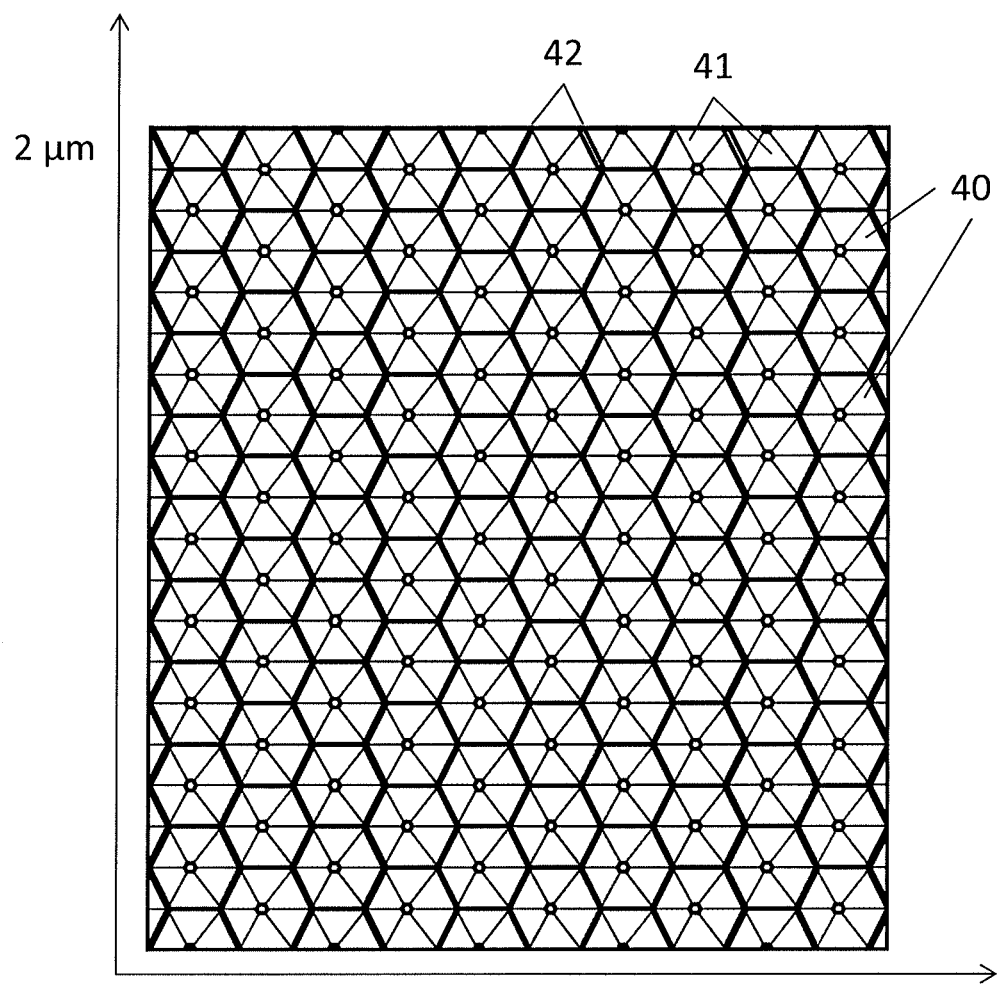
FIG. 6 illustrates the plan view of the submicro pillars with tapering tops formed by crystal facets according to one aspect of the present invention.

Subsequent GaN growth is performed through the nano-scale openings M10 via selective-area growth mode thanks to the growth suppression on M11. Via growth parameter adjustment, such as V/III molar ratio, growth temperature and growth pressure, high-density GaN submicro pillars 30 are formed. Pillars 30 are characterized by a pillar height L and a pillar diameter D of the pillar body. Note that the pillar diameter D can be much bigger than the diameter Ø of the nano-scale openings. The pillar diameter D can be in the range of 140-1000 nm, such as 200-500 nm. Pillars 30 can have a cylindrical shape or other shape depending on the shape of opening M10. When pillar 30 is not in a cylindrical shape, the pillar diameter D represents the maximum transverse dimension of the cross section. And the pillar height L can be in the range from 0 nm to 1000 nm, such as 500-800 nm. The pillar diameter D and the pillar height L can also be more than 1000 nm. Pillars 30 are also characterized by a tapering pillar top 40 formed by crystal facets 41. A plane view of the submicro facet structure of FIG. 5 is shown in FIG. 6. Tapering pillar tops 40 shown in FIG. 5 can also possess a truncated top which is formed by a vanishing c-plane, as long as the vanishing c-plane area is smaller enough than that of the facets 41. In some embodiments, the c-plane area can be less than 10% of that of the facets 41.

When the pillar height L is non-zero, pillar 30 contains sidewall surface 31, preferably made of m-planes (10.0). When the pillar height L is zero, pillars 30 shrink into pillar tops 40 containing facets 41, which can be made to belong to (10.1) or (11.1) planes. Preferably, pillar height L is at least 500 nm, displacing the facets 41 from the mask layer M1 to avoid any regrowth contamination.

Optionally, pillars 30 are further characterized by having a pillar gap 42 between the pillar bodies of neighboring pillars 30. The pillar gap 42 can be ranged from 0 to 200 nm, preferably less than 100 nm and larger than 0 nm, for example, larger than 3 nm or 8 nm, less than 80 nm or 60 nm. Generally speaking, the pillar gap 42 is defined as the shortest distance between sidewall surfaces 31 of neighboring pillars 30. When gap 42 is non-zero, chances are that threading dislocations can be terminated at sidewall surface 31, resulting in defect-reduced facet 41 for subsequent epitaxial growth. On the other hand, pillar gap 42 should be small enough to prevent subsequent active-region growth on sidewall surface 31 through gap 42 since active-region coated sidewall surface 31 will have too large surface area and contribute to large light loss due to absorption. This means that the pillar diameter D is preferred to be close to the hexagonal lattice constant a of the nano-scale openings M10 (see inset to FIG. 2-4). Preferably, active-region is only formed over facets 41, meaning that the layer or layers of the active region only grow from facets 41, not sidewall surface 31.

The formation of pillars 30 with desired sidewall surfaces 31 (therefore the pillar body) and facets 41 is made possible via growth parameter changes. Sidewall surfaces 31, which are preferably made of m-planes (10.0) or a-planes (11.0), can be achieved via growth at higher temperatures, lower pressures and lower V/III molar ratio. Facets 41, which are preferably made of (10.1) or (11.1) planes, can be obtained via growth at lower temperatures, higher pressures and higher V/III molar ratio. For example, sidewall surfaces 31 can be formed by GaN growth at a temperature higher than 1000° C., such as 1000-1200, 1050-1180, or 1100-1150° C., with a growth pressure less than 200 torr, such as 200-50, or 150-100 torr, and a V/III ratio smaller than 200, such as 200-100, or 180-130, while facets 41 can be formed by performing GaN growth at a temperature less than 1000° C., such as 950-700, or 880-750° C., with a growth pressure higher than 200 torr, such as 200-500, or 350-450 torr, and a V/III ratio larger than 2000 such as 2000-3000, or 2300-2700. Selecting these growth conditions and circular openings M10 will favor the formation of (10.1) facets. The formation of (11.1) facets is favored under these growth conditions with hexagonal (not circular) openings M10 where the hexagonal sides are perpendicular to GaN <11.0> directions.

Figure 7:
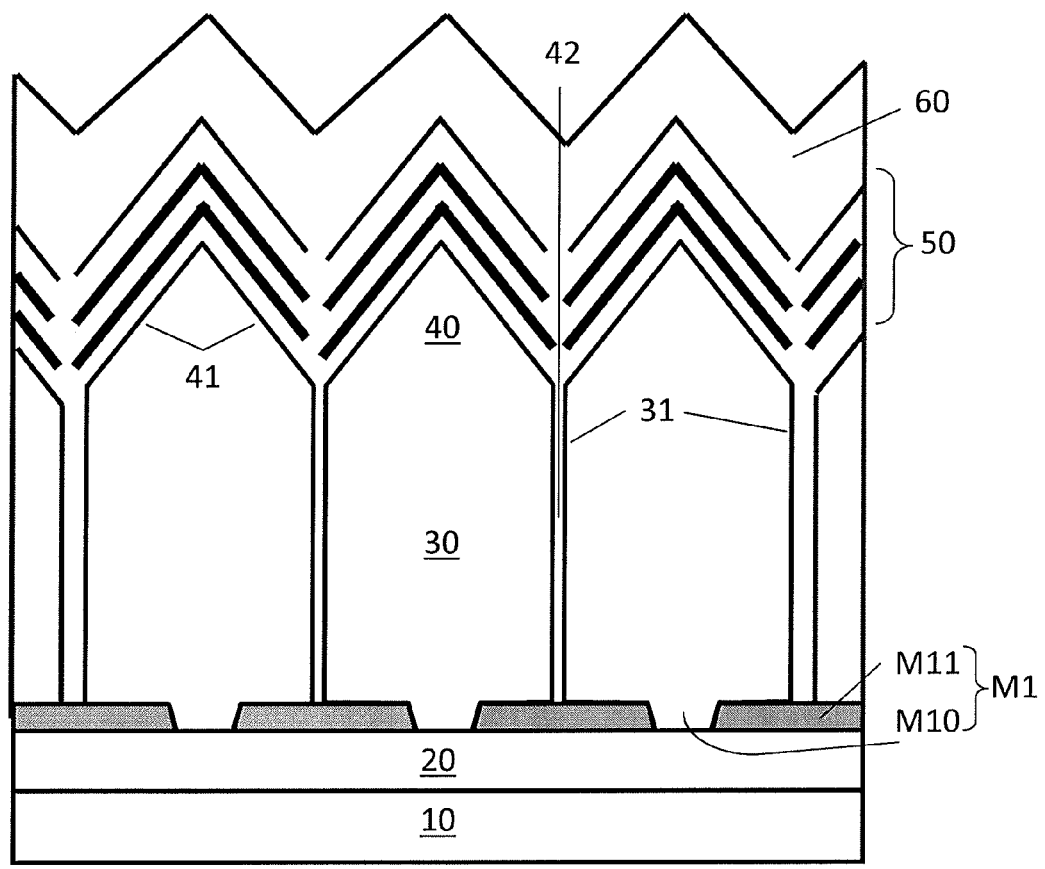
FIG. 7 illustrates a light-emitting device structure formed with submicro facets active-region and p-type layers, according to one aspect of the present invention.

Shown in FIG. 7 is a light-emitting device structure formed on pillars 30 according to an embodiment of the present invention. As shown, active-region 50 is conformally formed on facets 41, and preferably, there is no active-region formation on sidewall surfaces 31. If pillar gap 42 is zero, active-region 50 formed on facets 41 is in a continuous way. If pillar gap 42 is non-zero, active-region 50 formed on facets 41 may contain many individual unit areas corresponding to each pillar. The active-region 50 can be GaN/InGaN MQW, AlGaN/InGaN MQW, AlGaN/GaN MQW, AlInGaN/InGaN MQW. Formed over active-region 50 is a p-type layer 60, which can contain a p-AlGaN layer, p-GaN layer and optionally a p-InGaN layer. P-layer 60 seals pillar gap 42 if any and provides electrical connection for each pillar. Care should be taken so that p-type layer 60 is not directly connected to pillars 30 without passing through active-region 50.

Further to p-layer 60, a transparent conductive layer (TCL) 70 can be formed above p-layer 60, as shown in FIG. TCL layer 70 can be an indium tin oxide (ITO) layer, Aluminum doped ZnO (AZO) layer, Mo-doped Indium oxide ($In_2O_3$:Mo) layer, F-doped tin oxide ($SnO_2$:F) layer, $ZnSnO_3$ layer and the like.

To enhance the probability of dislocation termination at sidewall surfaces 31, pillars 30 can be replaced by pillars 30', which contain a strain-modulation structure 33 to bend dislocations 35 towards sidewall surfaces 31. After a short growth of layer 32, strain-modulation structure 33 is incorporated. Layer 34 is form on strain-modulation structure 33.

Strain-modulation structure 33 can be an AlGaN/GaN, GaN/InGaN superlattice structure. It is preferably to be a AlGaN/GaN superlattice structure or multi-layer structure, wherein the AlGaN layer thickness is from 2 nm to 20 nm, and Al-composition is from 100% to 20%, and the GaN layer thickness is from 10 nm to 50 nm. The AlGaN/GaN superlattice or multilayer structure is preferred to be of at least 5 pairs, or 10-20 pairs. The strain-modulation within the superlattice structure will increase the possibility for dislocations 35 to terminate at surfaces 31. To have the dislocation bending effectiveness, the strain difference (contrast) between different layers of the superlattice structure has to be bigger than 0.5%. That is to say, if layer 20 and layer 32 are GaN layers, and strain-modulation structure is AlGaN/GaN superlattice, the Al-fraction has to be larger than 20%. If layer 20 and layer 32 are GaN layers, and strain-modulation structure is GaN/InGaN superlattice, the In-fraction has to be larger than 4%.

Further, strain-modulation structure 33 can also be GaN layers separated by a few times of silane+ ammonia treatments during GaN growth. For example, strain-modulation structure 33 contains at least one time silane treatment during GaN growth. That is to say, during the formation of strain-modulation structure 33, gallium source is stopped at least once while silane is introduced with a dose of 100-1000 nano-mole. This silane treatment is characterized by a silicon concentration depth profile with a peak concentration value of above $5\times10^{19}$ cm$^{-3}$, and a full-width at half-maximum (FWHM) of 15-20 nm, when being measured by a depth profiling metrology such as secondary ion mass spectrometry (SIMS).

Figure 8:
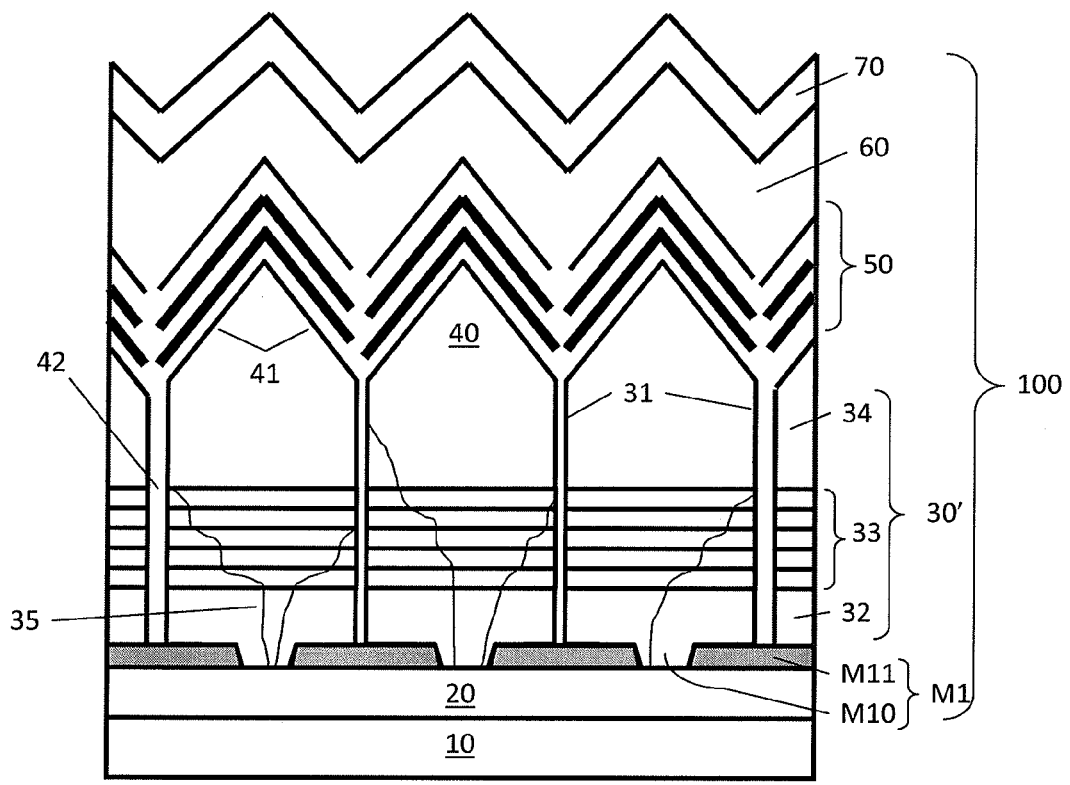
FIG. 8 illustrates a light-emitting device structure formed with submicro facets active-region and p-type layers, according to one aspect of the present invention.

The light-emitting structure illustrated in FIG. 8 is labeled as light-emitting structure 100, comprising mask layer M1, pillars 30 or 30', pillar tops 40, active-region 50, p-type layer 60 and TCL layer 70.

Figure 9:
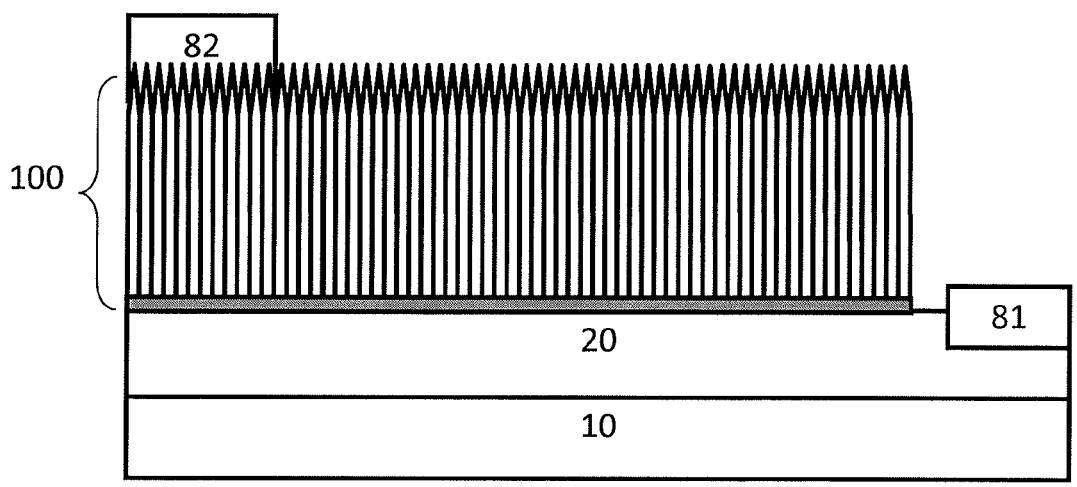
FIG. 9 illustrates a light-emitting device structure formed with submicro facets active-region and p-type layers, according to one aspect of the present invention.

As shown in FIG. 9, the light-emitting structure 100 is finally fabricated into a light emitting device, with an n-type electrode 81 formed on top of layer 20 and p-type electrode 82 formed on p-type layer 60 or TCL layer 70. Light emitting structure 100 contains high density submicro pillars and faceted pillar tops. The light emitting active-region formed on the faceted pillar tops are electrically connected on the p-side via p-type layer 60 and/or TCL layer 70, and on the n-side via layer 20. Light emitting device shown in FIG. 9 according to an embodiment of the present invention is capable of emitting improved lumen per device for general solid state lighting applications.

The wavy active-region structure of the present invention can be applied to different types of light emitting devices such as a vertical thin-film light-emitting device. The fabrication of vertical thin-film light-emitting device is known in the prior art. For example, in the light-emitting structure illustrated in FIGS. 8 and 9, after the transparent conductive layer (TCL) 70 is formed over the p-type layer 60, a conductive reflector instead of p-electrode 82 is formed over the transparent conductive layer 70. Then the whole structure is bonded to a conductive superstrate on the conductive reflector side, and the original substrate 10 is removed by known methods such as laser lift-off, chemical etching, wafer lapping/polishing, and ion-coupled plasma (ICP) etching. Finally, another transparent current-spreading layer is formed in place of the substrate 10, on which a cathode contact is then formed. An anode contact is formed on the conductive reflector.

The present invention has been described using exemplary embodiments. However, it is to be understood that the scope of the present invention is not limited to the disclosed embodiments. On the contrary, it is intended to cover various modifications and similar arrangement or equivalents which can be obtained by a person skilled in the art without creative work or undue experimentation. The scope of the claims, therefore, should be accorded the broadest interpretation so as to encompass all such modifications and similar arrangements and equivalents.

What is claimed is:

1. A light emitting device comprising:
   an n-type layer;
   a p-type layer;
   an active region sandwiched between the n-type layer and the p-type layer;
   wherein the active-region has a wavy structure with nano or micro fluctuations in its thickness direction;
   wherein the n-type layer comprises crystal facets on its upper surface, and the active-region is conformally formed on the upper surface of the n-type layer and substantially follows the shape of the crystal facets so as to form the wavy structure;
   wherein the n-type layer comprises (00.1)-oriented III-nitride pillars and the crystal facets are formed on top of the (00.1)-oriented III-nitride pillars, wherein each of the pillars provides six facets due to six-fold crystal structure symmetry; or the n-type layer comprises (111)-oriented III-nitride pillars and the crystal facets are formed on top of the (111)-oriented III-nitride pillars, wherein each of the pillars provides four facets due to four-fold crystal structure symmetry; and
   wherein the (00.1)-oriented III-nitride pillars contain a strain-modulation structure which contains a silicon concentration peak of above $5\times10^{19}$ cm$^{-3}$ with a full-width at half-maximum (FWHM) of 15-20 nm, when being measured by a depth profiling metrology such as secondary ion mass spectrometry (SIMS).

2. The light-emitting device according to claim 1, wherein the (00.1)-oriented III-nitride pillars are arranged in a hexagonal lattice pattern with a lattice constant of 150 nm to 1000 nm and the diameter of the pillars is from 140 nm to 1000 nm.

3. The light-emitting device according to claim 2, wherein the (00.1)-oriented III-nitride pillars have a density of $5\times10^8$ cm$^{-2}$ to $5\times10^9$ cm$^{-2}$.

4. The light-emitting device according to claim 1, wherein the (00.1)-oriented III-nitride pillars contain an AlGaN/GaN superlattice structure, with Al-fraction not less than 20%, or contain a GaN/InGaN superlattice structure, with In-fraction not less than 4%.

5. The light-emitting device according to claim 1, wherein gaps are formed between neighboring (00.1)-oriented III-nitride pillars.

6. The light-emitting device according to claim 1, wherein the (00.1)-oriented III-nitride pillars have a height larger than 500 nm.

7. The light-emitting device according to claim 1, further comprising a mask layer embedded in the n-type layer, wherein the mask layer consists of a growth suppression area and a growth seeding area formed by nano-scale openings, and the (00.1)-oriented III-nitride pillars grow from and penetrate through the openings.

8. The light-emitting device according to claim 2, wherein the (00.1)-oriented III-nitride pillars are arranged in a hexagonal lattice pattern with a lattice constant of 150 nm to 500 nm and the diameter of the pillars is from 140 nm to 500 nm.

9. The light-emitting device according to claim 1, wherein the crystal facets comprise (10.1) facets or (11.1) facets.

10. A light emitting device comprising:
    an n-type layer comprising pillars extruding along a thickness direction of the n-type layer, wherein each of the pillars has a pillar body and a tapering pillar top formed on top of the pillar body, and the tapering pillar top has crystal facets;

a p-type layer;

an active region sandwiched between the n-type layer and the p-type layer;

wherein the active-region has a wavy structure with nano or micro fluctuations in its thickness direction, the active-region is conformally formed on the crystal facets of the tapering pillar tops of the pillars and substantially follows the shape of the crystal facets so as to form the wavy structure;

wherein the pillars are formed from (00.1)-oriented III-nitride, and each of the pillar tops contains six crystal facets due to six-fold crystal structure symmetry; or the pillars are form from (111)-oriented III-nitride, and each of the pillar tops contains four facets due to four-fold crystal structure symmetry;

wherein the pillars formed from (00.1)-oriented III-nitride contain a strain-modulation structure which contains a silicon concentration peak of above $5 \times 10^{19}$ cm$^{-3}$ with a full-width at half-maximum (FWHM) of 15-20 nm, when being measured by a depth profiling metrology such as secondary ion mass spectrometry (SIMS).

11. The light-emitting device according to claim 5, wherein the gaps between neighboring (00.1)-oriented III-nitride pillars have a dimension of 3-200 nm.

\* \* \* \* \*